US012378439B2

(12) United States Patent
Lauter et al.

(10) Patent No.: US 12,378,439 B2
(45) Date of Patent: Aug. 5, 2025

(54) COMPOSITIONS FOR TUNGSTEN ETCHING INHIBITION

(71) Applicant: BASF SE, Ludwigshafen am Rhein (DE)

(72) Inventors: Michael Lauter, Ludwigshafen am Rhein (DE); Haci Osman Guevenc, Ludwigshafen am Rhein (DE); Wei Lan Chiu, Taoyuan (TW); Te Yu Wei, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 58 days.

(21) Appl. No.: 17/632,816

(22) PCT Filed: Aug. 4, 2020

(86) PCT No.: PCT/EP2020/071925
§ 371 (c)(1),
(2) Date: Feb. 4, 2022

(87) PCT Pub. No.: WO2021/023748
PCT Pub. Date: Feb. 11, 2021

(65) Prior Publication Data
US 2022/0267643 A1 Aug. 25, 2022

(30) Foreign Application Priority Data
Aug. 8, 2019 (EP) .................................... 19190716

(51) Int. Cl.
C09G 1/02 (2006.01)
B24B 1/00 (2006.01)
B24B 37/04 (2012.01)
C09G 1/00 (2006.01)
C09G 1/04 (2006.01)
C09G 1/06 (2006.01)
C09K 3/14 (2006.01)
C09K 13/06 (2006.01)
C23F 11/14 (2006.01)
C23F 11/173 (2006.01)
H01L 21/306 (2006.01)
H01L 21/321 (2006.01)

(52) U.S. Cl.
CPC ............... C09G 1/02 (2013.01); B24B 1/00 (2013.01); B24B 37/044 (2013.01); C09G 1/00 (2013.01); C09G 1/04 (2013.01); C09G 1/06 (2013.01); C09K 3/1454 (2013.01); C09K 3/1463 (2013.01); C09K 13/06 (2013.01); C23F 11/14 (2013.01); C23F 11/173 (2013.01); H01L 21/30625 (2013.01); H01L 21/3212 (2013.01)

(58) Field of Classification Search
None
See application file for complete search history.

(56) References Cited

U.S. PATENT DOCUMENTS

| 5,230,833 | A | 7/1993 | Romberger et al. |
| 5,952,505 | A | 9/1999 | Banholzer |
| 6,063,306 | A | 5/2000 | Kaufman et al. |
| 6,083,419 | A | 7/2000 | Grumbine et al. |
| 6,273,786 | B1 | 8/2001 | Chopra et al. |
| 9,303,188 | B2 | 4/2016 | Grumbine et al. |
| 2008/0242091 | A1* | 10/2008 | Kato ............... H01L 21/3212 438/693 |
| 2010/0056026 | A1 | 3/2010 | Shirota et al. |
| 2010/0210184 | A1 | 8/2010 | Narita |
| 2011/0171832 | A1 | 7/2011 | Hagan et al. |
| 2015/0021513 | A1 | 1/2015 | Kim et al. |
| 2015/0027978 | A1 | 1/2015 | Barnes et al. |
| 2015/0184028 | A1 | 7/2015 | Jung |
| 2016/0280962 | A1 | 9/2016 | Zhou et al. |
| 2017/0200601 | A1 | 7/2017 | Song et al. |
| 2017/0260449 | A1 | 9/2017 | Barnes et al. |
| 2018/0130706 | A1 | 5/2018 | Chen et al. |
| 2019/0085207 | A1 | 3/2019 | Onishi et al. |

FOREIGN PATENT DOCUMENTS

| CN | 1312845 A | 9/2001 |
| CN | 102373012 A | 3/2012 |
| CN | 105983441 A | 10/2016 |
| CN | 107155367 A | 9/2017 |
| CN | 109312213 A | 2/2019 |
| EP | 1098948 B1 | 11/2005 |
| EP | 3081614 A2 | 10/2016 |
| JP | 2008-251677 A | 10/2008 |
| JP | 2008-277735 A | 11/2008 |
| JP | 2008-300401 A | 12/2008 |
| JP | 2015-506583 A | 3/2015 |
| JP | 2016-196632 A | 11/2016 |
| KR | 10-2012-0096948 A | 8/2012 |

(Continued)

OTHER PUBLICATIONS

PCT International Preliminary Report on Patentability issued on Feb. 8, 2022.*
European Search Report for EP Patent Application No. 19190716.1, Issued on Feb. 21, 2020, 3 pages.
Kuntzsch, et al., "Characterization of Slurries Used for Chemical-Mechanical Polishing (CMP) in the Semiconductor Industry", Chemical Engineering and Technology, vol. 26, Issue 12, Nov. 17, 2003, pp. 1235-1239.
International Preliminary Report on Patentability received for PCT Patent Application No. PCT/EP2020/071925, mailed on Feb. 17, 2022, 8 pages.

(Continued)

Primary Examiner — Jiong-Ping Lu
(74) Attorney, Agent, or Firm — Faegre Drinker Biddle & Reath LLP

(57) ABSTRACT

The presently claimed invention relates to compositions and methods for inhibition of etching. The presently claimed invention particularly relates to a composition and methods for inhibition of tungsten etching.

12 Claims, No Drawings

(56) References Cited

FOREIGN PATENT DOCUMENTS

| | | | | |
|---|---|---|---|---|
| TW | 413680 B | 12/2000 | | |
| TW | 201619354 A | 6/2016 | | |
| TW | 201713744 A | 4/2017 | | |
| WO | 2016/042408 A2 | 3/2016 | | |
| WO | 2017/163942 A1 | 9/2017 | | |
| WO | WO2017208667 | * | 12/2017 | |
| WO | WO2017212874 | * | 12/2017 | ............. B24B 37/00 |
| WO | 2020/017283 A1 | 1/2020 | | |

OTHER PUBLICATIONS

International Search Report and Written Opinion received for PCT Patent Application No. PCT/EP2020/071925, mailed on Nov. 9, 2020, 9 pages.

Pubchem: "Benzethonium : C27H42N02+—PubChem", Feb. 10, 2020, XP055666649, Retrieved from the Internet: URL:https://pubchem.ncbi.nlm.nih.gov/compo und/Benzethonium#/section=MeSH-Entry-Terms& fullscreen=true.

* cited by examiner

COMPOSITIONS FOR TUNGSTEN ETCHING INHIBITION

CROSS-REFERENCE TO RELATED APPLICATIONS

This application is a national stage application (under 35 U.S.C. § 371) of PCT/EP2020/071925, filed Aug. 4, 2020, which claims benefit of European Application No. 19190716.1, filed Aug. 8, 2019, both of which are incorporated herein by reference in their entirety.

TECHNICAL FIELD

The presently claimed invention relates to compositions and methods for inhibition of etching. The presently claimed invention particularly relates to compositions and methods for inhibition of tungsten etching.

BACKGROUND

Integrated circuits forming the semiconductor devices are made up of active devices that are chemically and physically connected into a substrate and are interconnected through the use of multilevel interconnects. Typically, the multilevel interconnects form functional circuits and comprise a first metal layer, an interlevel dielectric layer and optionally a third metal layer. As each layer is formed, the layer is planarized to enable subsequent layers to be formed on the newly formed layer. In the semiconductor industry, chemical mechanical polishing (CMP) is a well-known technology that is applied in fabricating advanced photonic, microelectromechanical and microelectronic materials and devices, such as semiconductor wafers.

CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. In a typical CMP process step, a rotating wafer holder brings the to-be-polished wafer in contact with a polishing pad. The CMP composition is usually applied between the to-be-polished wafer and the polishing pad.

With the continuous shrink of the feature size in the ultra-large-scale integrated circuits (ULSI) technology, the size of the copper interconnect structure is getting smaller and smaller. To reduce the RC delay, which is the delay in signal speed through the circuit wiring as a result of resistance (R) and capacitance (C), the thickness of the barrier or adhesion layer in the copper interconnect structure is getting thinner. The traditional copper barrier/adhesion layer stack Ta/TaN is not suitable any more, as the resistivity of Ta is relatively high, and copper cannot be directly electroplated onto Ta. The use of tungsten as a conductive material to form the interconnect is increasing. In a typical fabrication process, CMP is employed to reduce the thickness of the tungsten over-layer until a planar surface that exposes elevated portions of silicon dioxide and forms the dielectric layer is obtained. Generally, the CMP compositions for polishing tungsten-containing substrates comprise compounds capable of etching tungsten. The compounds capable of etching tungsten convert tungsten into a soft oxidized film that is capable of removal by mechanical abrasion. In the polishing step of the CMP process, the over-coating layer of tungsten is removed to achieve the planarity of the substrate. However, during this process, tungsten can be undesirably eroded by the combination of static etching and mechanical action of the abrasives leading to dishing or erosion.

In the state of the art, compositions comprising inhibitors for tungsten etching are known and described, for instance, in the following references.

U.S. Pat. No. 6,273,786 B1 describes methods and compositions comprising tungsten corrosion inhibitors to protect tungsten that include phosphates, polyphosphates and silicates, specifically potassium hypophosphite and potassium silicate.

U.S. Pat. No. 6,083,419 A describes a chemical mechanical polishing composition comprising a compound that is capable of etching tungsten, at least one inhibitor of tungsten etching, wherein the inhibitor of tungsten etching is a compound including at least one functional group selected from nitrogen containing heterocycles without nitrogen-hydrogen bonds, sulphides, oxazolidines or mixtures of functional groups in one compound.

U.S. Pat. No. 9,303,188 B2 discloses a chemical mechanical polishing composition including an amine compound that inhibits tungsten etching.

The methods and compositions disclosed in the prior art have limitations. In the methods and compositions disclosed in the prior art, the inhibitors are not always effective at preventing erosion of tungsten within the trenches. In addition, the use of high concentrations of the inhibitors known in the prior art can reduce the polishing rates of substrates comprising tungsten layers to unacceptably low levels. Therefore, there is a need for improved compositions and methods for inhibition of tungsten etching and compositions that can provide reduced erosion of tungsten during the CMP process.

Hence, it is an object of the presently claimed invention to provide an improved composition and improved methods for the inhibition of tungsten etching.

SUMMARY

Surprisingly, it was found that the compositions of the presently claimed invention as described hereinbelow provide a low static etching rate for tungsten and can inhibit tungsten etching.

Accordingly, in one aspect of the presently claimed invention, a composition for inhibition of tungsten etching is provided, comprising:
  (A) at least one inorganic abrasive particle;
  (B) at least one corrosion inhibitor selected from methylbenzethonium, methylbenzethonium salts, benzethonium and benzethonium salts; and
  (C) an aqueous medium; and
  wherein the pH of the composition is in the range of from ≥5.0 to ≤11.0.

In another aspect, the presently claimed invention is directed to a process for the manufacture of a semiconductor device comprising the chemical mechanical polishing of a substrate (S) used in the semiconductor industry, wherein the substrate (S) comprises
  (i) tungsten and/or
  (ii) tungsten alloys
in the presence of a composition described herein.

In another aspect, the presently claimed invention is directed to the use of a composition described herein to inhibit etching of tungsten.

The presently claimed invention is associated with at least one of the following advantages:

(1) The compositions and the methods of the presently claimed invention show an improved performance in inhibition of etching, specifically inhibition of etching of tungsten.
(2) The compositions and the methods of the presently claimed invention prevent erosion of tungsten during chemical mechanical polishing of tungsten-containing substrates.
(3) The composition of the presently claimed invention provides a stable formulation or dispersion, wherein no phase separation occurs.
(4) The process of the presently claimed invention is easy to apply and requires as few steps as possible.
(5) The compositions and the methods of the presently claimed invention do not affect the polishing rates of substrates during chemical mechanical polishing.

Other objects, advantages and applications of the presently claimed invention will become apparent to those skilled in the art from the following detailed description.

DETAILED DESCRIPTION

The following detailed description is merely exemplary in nature and is not intended to limit the presently claimed invention or the application and uses of the presently claimed invention. Furthermore, there is no intention to be bound by any theory presented in the preceding technical field, background, summary or the following detailed description.

The terms "comprising", "comprises" and "comprised of" as used herein are synonymous with "including", "includes" or "containing", "contains", and are inclusive or open-ended and do not exclude additional, non-recited members, elements or method steps. It will be appreciated that the terms "comprising", "comprises" and "comprised of" as used herein comprise the terms "consisting of", "consists" and "consists of".

Furthermore, the terms "(a)", "(b)", "(c)", "(d)" etc. and the like in the description and in the claims, are used for distinguishing between similar elements and not necessarily for describing a sequential or chronological order. It is to be understood that the terms so used are interchangeable under appropriate circumstances and that the embodiments of the presently claimed invention described herein are capable of operation in other sequences than described or illustrated herein. In case the terms "(A)", "(B)" and "(C)" or "(a)", "(b)", "(c)", "(d)", "(i)", "(ii)" etc. relate to steps of a method or use or assay there is no time or time interval coherence between the steps, that is, the steps may be carried out simultaneously or there may be time intervals of seconds, minutes, hours, days, weeks, months or even years between such steps, unless otherwise indicated in the application as set forth herein above or below.

In the following passages, different aspects of the presently claimed invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

Reference throughout this specification to "one embodiment" or "an embodiment" or "preferred embodiment" means that a particular feature, structure or characteristic described in connection with the embodiment is included in at least one embodiment of the presently claimed invention. Thus, appearances of the phrases "in one embodiment" or "in an embodiment" or "in a preferred embodiment" in various places throughout this specification are not necessarily all referring to the same embodiment but may refer. Furthermore, the features, structures or characteristics may be combined in any suitable manner, as would be apparent to a person skilled in the art from this disclosure, in one or more embodiments. Furthermore, while some embodiments described herein include some, but not other features included in other embodiments, combinations of features of different embodiments are meant to be within the scope of the subject matter, and form different embodiments, as would be understood by those in the art. For example, in the appended claims, any of the claimed embodiments can be used in any combination.

Furthermore, the ranges defined throughout the specification include the end values as well, i.e. a range of 1 to 10 implies that both 1 and 10 are included in the range. For the avoidance of doubt, the applicant shall be entitled to any equivalents according to applicable law.

For the purposes of the presently claimed invention, '% by weight' or 'wt. %' as used in the presently claimed invention is with respect to the total weight of the coating composition. Further, sum of wt. % of all the compounds, as described hereinbelow, in the respective component adds up to 100 wt.-%.

For the purposes of the presently claimed invention, a corrosion inhibitor is defined as a chemical compound forming a protective molecular layer on the surface of a metal.

For the purposes of the presently claimed invention, a chelating agent is defined as a chemical compound that forms soluble, complex molecules with certain metal ions, inactivating the ions so that they cannot normally react with other elements or ions to produce precipitates or scale. For the purposes of the presently claimed invention, a low-k material is a material having a k value (dielectric constant) of less than 3.5, preferably less than 3.0, more preferably less than 2.7. An ultra-low-k material Is a material having a k value (dielectric constant) of less than 2.4.

For the purposes of the presently claimed invention, colloidal inorganic particles are inorganic particles which are produced by a wet precipitation process; and fumed inorganic particles are particles produced by high temperature flame hydrolysis, for example metal chloride precursor with hydrogen in the presence of oxygen, for example using the Aerosil® process.

For the purposes of the presently claimed invention, "colloidal silica" refers to silicon dioxide that has been prepared by condensation polymerization of $Si(OH)_4$. The precursor $Si(OH)_4$ can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso® PL-1, PL-2, and PL-3 products, and the Nalco 1050, 2327 and 2329 products, as well as other similar products avail-able from DuPont, Bayer, Applied Research, Nissan Chemical, Nyacol and Clariant.

For the purposes of the presently claimed invention, the mean particle size is defined as the $d_{50}$ value of the particle size distribution of the inorganic abrasive particles (A) in the aqueous medium (H).

For the purposes of the presently claimed invention, the mean particle size is measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For the purposes of the presently claimed invention, for dynamic light scattering (DLS), typically a Horiba LB-550 V (DLS, dynamic light scattering measurement) or any other such instrument is used. This technique measures the hydrodynamic diameter of the particles as they scatter a laser light source (λ=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

For the purposes of the presently claimed invention, the decay constants are proportional to the diffusion coefficient, $D_t$, of the inorganic abrasive particle and are used to calculate particle size according to the Stokes-Einstein equation:

$$D_h = \frac{k_B T}{3\pi \eta D_t}$$

where the suspended particles are assumed to (1) have a spherical morphology and (2) be uniformly dispersed (i.e. not agglomerated) throughout the aqueous medium. This relationship is expected to hold true for particle dispersions that contain lower than 1% by weight of solids as there are no significant deviations in the viscosity of the aqueous dispersant, in which η=0.96 mPa·s (at T=22° C.). The particle size distribution of the fumed or colloidal inorganic particle dispersion is usually measured in a plastic cuvette at 0.1 to 1.0% solid concentration and dilution, if necessary, is carried out with the dispersion medium or ultra-pure water.

For the purposes of the presently claimed invention, the BET surface of the inorganic abrasive particles is determined according to DIN ISO 9277:2010-09.

For the purposes of the presently claimed invention, an oxidizing agent is defined as a chemical compound which can oxidize the to-be-polished substrate or one of its layers.

For the purposes of the presently claimed invention, a pH adjusting agent is defined as a compound which is added to have its pH value adjusted to the required value.

For the purposes of the presently claimed invention, the measurement techniques disclosed are well known to a person skilled in the art and therefore do not limit the presently claimed invention.

In an aspect of the presently claimed invention, a composition for inhibition of tungsten is provided comprising the following components:
 (A) at least one inorganic abrasive particle;
 (B) at least one corrosion inhibitor selected from methylbenzethonium, methylbenzethonium salts, benzethonium and benzethonium salts; and
 (C) an aqueous medium; and
 wherein the pH of the composition is in the range of from ≥5.0 to ≤11.0.

The composition comprises the components (A), (B) and (C) and further components as described below.

In an embodiment of the presently claimed invention, the at least one inorganic abrasive particle (A) is selected from the group consisting of metal oxides, metal nitrides, metal carbides, silicides, borides, ceramics, diamond, organic hybrid particles, inorganic hybrid particles and silica.

For the purposes of the presently claimed invention, the chemical nature of the at least one inorganic abrasive particle (A) is not particularly limited. The at least one inorganic abrasive particle (A) may be of the same chemical nature or may be a mixture of particles of different chemical nature. For the purposes of the presently claimed invention, inorganic abrasive particles (A) of the same chemical nature are preferred. The inorganic abrasive particles (A) are selected from the group consisting of a metal oxide, a metal nitride, a metal carbide, including a metalloid, a metalloid oxide or carbide, a silicide, a boride, a ceramic, a diamond, an organic/inorganic hybrid particle, silica, and any mixture of inorganic particles.

For the purposes of the presently claimed invention, the at least one inorganic abrasive particle (A) can be
 of one type of colloidal inorganic particles,
 of one type of fumed inorganic particles,
 a mixture of different types of colloidal and/or fumed inorganic particles.

For the purposes of the presently claimed invention, the at least one inorganic particle (A) is selected from the group consisting of colloidal or fumed inorganic particle or a mixture thereof.

Among them, oxides and carbides of metals or metalloids are preferred. For the purposes of the presently claimed invention, the at least one inorganic particle (A) is preferably selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. For the purposes of the presently claimed invention, the at least one inorganic particle (A) is more preferably selected from the group consisting of alumina, ceria, silica, titania, zirconia, or mixtures or composites thereof. In particular, the at least one inorganic abrasive particle (A) is silica. For the purposes of the presently claimed invention, the at least one inorganic particle (A) is most preferably colloidal silica particle.

In another embodiment of the presently claimed invention, the concentration of the at least one inorganic abrasive particle (A) is in the range of from ≥0.01 wt. % to ≤10.0 wt. %, based on the total weight of the composition.

For the purposes of the presently claimed invention, the concentration of the at least one inorganic abrasive particle (A) is not more than 10.0 wt. %, preferably not more than 5.0 wt. %, particularly not more than 3.0 wt. %, for example not more than 2.0 wt. %, most preferably not more than 1.8 wt. %, particularly not more than 1.5 wt. %, based on the total weight of the composition. For the purposes of the presently claimed invention, the concentration of the at least one inorganic abrasive particle (A) is preferably at least 0.01 wt. %, more preferably at least 0.1 wt. %, most preferably at least 0.2 wt. %, particularly at least 0.3 wt. %, based on the total weight of the composition. For the purposes of the presently claimed invention, the concentration of the at least one inorganic abrasive particle (A) is more preferably in the range of from ≥0.3 wt. % to ≤1.2 wt. %, based on the total weight of the composition.

For the purposes of the presently claimed invention, the at least one inorganic abrasive particle (A) can be contained in the composition in various particle size distributions. The particle size distribution of the at least one inorganic abrasive particle (A) can be monomodal or multimodal.

In case of a multimodal particle size distribution, a bimodal particle size distribution is often preferred. For the purposes of the presently claimed invention, a monomodal particle size distribution is preferred for the inorganic abrasive particles (A). The particle size distribution of the inorganic abrasive particles (A) is not particularly limited.

In a preferred embodiment of the presently claimed invention, the average particle diameter of the at least one inorganic abrasive particle (A) is in the range of $\geq 1$ nm to $\leq 1000$ nm, determined according to dynamic light scattering technique.

The mean or average particle size of the at least one inorganic abrasive particle (A) can vary within a wide range. For the purposes of the presently claimed invention, the mean particle size of the at least one inorganic abrasive particle (A) is preferably in the range of from $\geq 1$ nm to $\leq 1000$ nm, preferably in the range of from $\geq 10$ nm to $\leq 400$ nm, more preferably in the range of from $\geq 20$ nm to $\leq 200$ nm, more preferably in the range of from $\geq 25$ nm to $\leq 180$ nm, most preferably in the range of from $\geq 30$ nm to $\leq 170$ nm, particularly preferably in the range of from $\geq 40$ nm to $\leq 160$ nm, particularly most preferably in the range of from $\geq 45$ nm to $\leq 150$ nm, in each case measured with dynamic light scattering techniques using instruments for example a High Performance Particle Sizer (H PPS) from Malvern Instruments, Ltd. or Horiba LB550.

The BET surface of the at least one inorganic abrasive particle (A) can vary within a wide range.

For the purposes of the presently claimed invention, the BET surface of the at least one inorganic abrasive particle (A) is preferably in the range of from $\geq 1$ m$^2$/g to $\leq 500$ m$^2$/g, more preferably in the range of from $\geq 5$ m$^2$/g to $\leq 250$ m2/g, most preferably in the range of from $\geq 10$ m$^2$/g to $\leq 100$ m$^2$/g, particularly preferably in the range of from $\geq 20$ m$^2$/g to $\leq 95$ m$^2$/g, particularly most preferably in the range of from 25 m$^2$/g to 592 m$^2$/g, in each case determined according to DIN ISO 9277:2010-09.

For the purposes of the presently claimed invention, the at least one inorganic abrasive particle (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of agglomerates, cubes, cubes with bevelled edges, octahedrons, icosahedrons, cocoons, nodules or spheres with or without protrusions or indentations. For the purposes of the presently claimed invention, the inorganic abrasive particles (A) are preferably essentially spherical, whereby typically these have protrusions or indentations.

For the purposes of the presently claimed invention, the at least one inorganic abrasive particle (A) is preferably cocoon-shaped. The cocoons may be with or without protrusions or indentations. Cocoon-shaped particles are preferably particles with a minor axis of from $\geq 10$ nm to $\leq 200$ nm, and preferably a ratio of major/minor axis of from $\geq 1.4$ to $\leq 2.2$, more preferably of from $\geq 1.6$ to $\leq 2.0$. Preferably, they have an averaged shape factor of from $\geq 0.7$ to $\leq 1.97$, more preferably of from $\geq 0.77$ to $\leq 1.92$, preferably an averaged sphericity of from $\geq 0.4$ to $\leq 0.9$, more preferably of from $\geq 0.5$ to $\leq 1.7$ and preferably an averaged equivalent circle diameter of from $\geq 41$ nm to $\leq 66$ nm, more preferably of from $\geq 48$ nm to $\leq 60$ nm, in each case determined by transmission electron microscopy and scanning electron microscopy.

For the purposes of the presently claimed invention, the determination of the shape factor, the sphericity and the equivalent circle diameter of cocoon-shaped particles is explained hereinbelow.

The shape factor gives information on the shape and the indentations of an individual particle and can be calculated according to the following formula:

$$\text{shape factor} = 4\pi(\text{area}/\text{perimeter}2)$$

The shape factor of a spherical particle without indentations is 1. The value of the shape factor decreases when the number of indentations increases. The sphericity gives information on the elongation of an individual particle using the moment about the mean and can be calculated according to the following formula, wherein M are the centres of gravity of the respective particle:

$$\text{sphericity} = (Mxx - Myy) - [4Mxy2 + (Myy - Mxx)2]0.5/(Mxx - Myy) + [4Mxy2 + (Myy - Mxx)2]0.5$$

$$\text{elongation} = (1/\text{sphericity})0.5$$

wherein $$Mxx = \Sigma(x - x\text{mean})^2/N$$

$$Myy = \Sigma(y - y\text{mean})^2/N$$

$$Mxy = \Sigma[(x - x\text{mean})*(y - y\text{mean})]/N$$

N number of pixels forming the image of the respective particle x, y coordinates of the pixels xmean mean value of the x coordinates of the N pixels forming the image of said particle ymean mean value of the y coordinates of the N pixels forming the image of said particle The sphericity of a spherical particle is 1. The value of the sphericity decreases, when particles are elongated. The equivalent circle diameter (also abbreviated as ECD in the following) of an individual non-circular particle gives information on the diameter of a circle which has the same area as the respective non-circular particle. The averaged shape factor, averaged sphericity and averaged ECD are the arithmetic averages of the respective property, related to the analysed number of particles.

For the purposes of the presently claimed invention, the procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image having a resolution of 2 k, 16 Bit, 0.6851 nm/pixel is used for the analysis. The images are binary coded using the threshold after noise suppression. Afterwards, the particles are manually separated. Overlying and edge particles are discriminated and not used for the analysis. ECD, shape factor and sphericity as defined before are calculated and statistically classified.

For purposes of the presently claimed invention, representative examples of the cocoon-shaped particles include, but are not limited to, FUSO® PL-3 manufactured by Fuso Chemical Corporation having an average primary particle size (d1) of 35 nm and an average secondary particle size (d2) of 70 nm.

In a more preferred embodiment of the presently claimed invention, the at least one inorganic abrasive particle (A) is a silica particle having an average primary particle size (d1) of 35 nm and an average secondary particle size (d2) of 70 nm.

In a most preferred embodiment of the presently claimed invention, the at least one inorganic abrasive particle (A) is a colloidal silica particle having an average primary particle size (d1) of 35 nm and an average secondary particle size (d2) of 70 nm.

In another most preferred embodiment of the presently claimed invention, the at least one inorganic abrasive particle (A) is a cocoon-shaped silica particle having an average primary particle size (d1) of 35 nm and an average secondary particle size (d2) of 70 nm.

The composition further comprises at least one corrosion inhibitor (B) selected from methylbenzethonium, methylbenzethonium salts, benzethonium and benzethonium salts. The corrosion inhibitor (B) is different from the components (A), (C), (D), (E) and (F).

In an embodiment of the presently claimed invention, the at least one corrosion inhibitor (B) is benzethonium.

In a preferred embodiment of the presently claimed invention, the benzethonium salts are selected from the group consisting of benzethonium fluoride, benzethonium chloride, benzethonium bromide, benzethonium hydroxide and benzethonium citrate.

In another preferred embodiment of the presently claimed invention, the methylbenzethonium salts are selected from the group consisting of methylbenzethonium fluoride, methylbenzethonium chloride, methylbenzethonium bromide, methylbenzethonium hydroxide and methylbenzethonium citrate.

In an embodiment of the presently claimed invention, the at least one corrosion inhibitor (B) is present in an amount in the range of $\geq 0.0001$ wt. % to $\leq 0.009$ wt. %, based on the total weight of the composition.

For the purposes of the presently claimed invention, the at least one corrosion inhibitor (B) is preferably present in an amount of not more than 0.009 wt. %, more preferably not more than 0.08 wt. %, most preferably not more than 0.07 wt. %, most preferably not more than 0.06 wt. %, based on the total weight of the composition. The amount of (B) is preferably at least 0.0001 wt. %, more preferably at least 0.0002 wt. %, most preferably at least 0.0005 wt. %, particularly preferably at least 0.001 wt. % based on the total weight of the composition. For the purposes of the presently claimed invention, the concentration of the at least one corrosion inhibitor (B) is more preferably in the range of from $\geq 0.0005$ wt. % to $\leq 1009$ wt. %, most preferably in the range of from $\geq 0.001$ wt. % to $\leq 0.006$ wt. %, based on the total weight of the composition.

The composition further comprises an aqueous medium (C). The aqueous medium (C) can be of one type or a mixture of different types of aqueous media.

For the purposes of the presently claimed invention, the aqueous medium (C) can be any medium which contains water. Preferably, the aqueous medium (C) is a mixture of water and an organic solvent that is miscible with water. Representative examples of organic solvents include, but are not limited to, $C_1$ to $C_3$ alcohols, alkylene glycols and alkylene glycol derivatives. More preferably, the aqueous medium (C) is water. In an embodiment of the presently claimed invention, the aqueous medium (C) is deionized water.

For the purposes of the presently claimed invention, if the amounts of the components other than (C) are in total y wt. % t of the composition, then the amount of (C) is (100–y) wt. % of the composition.

For the purposes of the presently claimed invention, the amount of the aqueous medium (C) in the composition is not more than 99.9 wt. %, more preferably not more than 99.6 wt. %, most preferably not more than 99 wt. %, particularly preferably not more than 98 wt. %, particularly not more than 97 wt. %, for example not more than 95 wt. %, based on the total weight of the composition. For the purposes of the presently claimed invention, the amount of the aqueous medium (C) in the composition is at least 60 wt. %, more preferably at least 70 wt. %, most preferably at least 80 wt. %, particularly preferably at least 85 wt. %, particularly at least 90 wt. %, for example at least 93 wt. %, based on the total weight of the composition.

The properties of the composition may depend on the pH of the corresponding composition. For the purposes of the presently claimed invention, the pH value of the composition is preferably not more than 11.0, more preferably not more than 10.5, most preferably not more than 10.0, particularly preferably not more than 9.5, particularly most preferably not more than 9.0. For the purposes of the presently claimed invention, the pH value of the composition is preferably at least 5.0, more preferably at least 5.5, most preferably at least 6.0. For the purposes of the presently claimed invention, the pH value of the composition is preferably in the range of from $\geq 5.0$ to $\leq 11.0$, preferably from $\geq 5.0$ to $\leq 10.0$, more preferably from $\geq 5.0$ to $\leq 9.5$, most preferably from $\geq 5.5$ to $\leq 9.5$, particularly preferably from $\geq 6.0$ to $\leq 9.0$.

In an embodiment of the presently claimed invention, the pH of the composition is in the range of from $\geq 5.0$ to $\leq 10.0$.

In a preferred embodiment of the presently claimed invention, the pH of the composition is in the range of from $\geq 6.0$ to $\leq 9.0$.

The composition further comprises at least one corrosion inhibitor (D). The corrosion inhibitor (D) is different from the components (A), (B), (C), (E) and (F).

In an embodiment of the presently claimed invention, at least one corrosion inhibitor (D) is selected from polyacrylamides and polyacrylamide copolymers.

In a preferred embodiment of the presently claimed invention, the polyacrylamide copolymers are anionic or non-ionic polyacrylamide copolymers. For the purposes of the presently claimed invention, the polyacrylamide copolymers are not selected from cationic polyacrylamide copolymers preferably. The use of cationic polyacrylamide copolymers in the composition may lead to flocculation and instability. In a more preferred embodiment of the presently claimed invention, the polyacrylamide copolymers are non-ionic polyacrylamide copolymers.

In a particularly preferred embodiment of the presently claimed invention, the polyacrylamides are homopolymers of polyacrylamides.

In an embodiment of the presently claimed invention, the at least one corrosion inhibitor (D) is present in an amount in the range of $\geq 0.001$ wt. % to $\leq 0.5$ wt. %, based on the total weight of the composition.

For the purposes of the presently claimed invention, the at least one corrosion inhibitor (D) is preferably present in an amount of not more than 0.5 wt. %, more preferably not more than 0.4 wt. %, most preferably not more than 0.3 wt. %, most preferably not more than 0.2 wt. %, based on the total weight of the composition. The amount of (D) is preferably at least 0.001 wt. %, more preferably at least 0.002 wt. %, most preferably at least 0.001 wt. %, particularly preferably at least 0.01 wt. %, based on the total weight of the composition. For the purposes of the presently claimed invention, the concentration of the at least one corrosion inhibitor (D) is more preferably in the range of from ≥0.01 wt. % to ≤0.3 wt. %, most preferably is in the range of from ≥0.01 wt. % to ≤0.2 wt. %, based on the total weight of the composition.

In a preferred embodiment of the presently claimed invention, the weight average molecular weight of the at least one corrosion inhibitor (D) is in the range of from ≥5000 g/mol to ≤50,000 g/mol, determined according to gel permeation chromatography. In a more preferred embodiment of the presently claimed invention, the weight average molecular weight of the at least one corrosion inhibitor (D) is in the range of from ≥5000 g/mol to ≤40,000 g/mol, determined according to gel permeation chromatography. In a most preferred embodiment of the presently claimed invention, the weight average molecular weight of the at least one corrosion inhibitor (D) is in the range of from ≥7500 g/mol to ≤15,000 g/mol, determined according to gel permeation chromatography.

The composition further comprises at least one oxidizing agent (E). The oxidizing agent is different from the components (A), (B), (C), (D) and (F).

In an embodiment of the presently claimed invention, the at least one oxidizing agent (E) is selected from the group consisting of organic peroxides, inorganic peroxides, nitrates, persulfates, iodates, periodic acids, periodates, permanganates, perchloric acids, perchlorates, bromic acids and bromates.

In a preferred embodiment of the presently claimed invention, the at least one oxidizing agent (E) is selected from the group consisting of peroxide and ferric nitrate. In a more preferred embodiment of the presently claimed invention, the at least one oxidizing agent (E) is hydrogen peroxide.

In an embodiment of the presently claimed invention, the at least one oxidizing agent (E) is present in an amount in the range of ≥0.01 wt. % to ≤1.0 wt. %, based on the total weight of the composition.

For the purposes of the presently claimed invention, the concentration of the at least one oxidizing agent (E) is not more than 1.0 wt. %, more preferably not more than 0.9 wt. %, more preferably not more than 0.8 wt. %, most preferably not more than 0.5 wt. %, in each case based on the total weight of the composition. For the purposes of the presently claimed invention, the concentration of the at least one oxidizing agent (E) is at least 0.01 wt. %, more preferably at least 0.05 wt. %, most preferably at least 0.1 wt. %, in each case based on the total weight of the composition.

For the purposes of the presently claimed invention, the concentration of hydrogen peroxide as oxidizing agent is preferably ≥0.01 wt. % to ≤1.0 wt. %, more preferably ≥0.05 wt. % to ≤1.0 wt. %, most preferably ≥0.05 wt. % to ≤0.5 wt. %, particularly preferably ≥0.01 wt. % to ≤0.1 wt. %, in each case based on the total weight of the composition.

The composition of the presently claimed invention can further optionally contain at least one pH adjusting agent (F). The at least one pH adjusting agent (F) is different from the components (A), (B), (C), (D), and (E).

For the purposes of the presently claimed invention, the at least one pH adjusting agent (E) is selected from the group consisting of inorganic acids, carboxylic acids, amine bases, alkali hydroxides, ammonium hydroxides, including tetraalkylammonium hydroxides. Preferably, the at least one pH adjusting agent (E) is selected from the group consisting of nitric acid, sulfuric acid, phosphorous acid, phosphoric acid, ammonia, sodium hydroxide and potassium hydroxide. In particular, the pH adjusting agent (E) is potassium hydroxide.

For the purposes of the presently claimed invention, the amount of the at least one pH adjusting agent (E) is preferably not more than 10 wt. %, more preferably not more than 2 wt. %, most preferably not more than 0.5 wt. %, particularly not more than 0.1 wt. %, for example not more than 0.05 wt. %, based on the total weight of the composition. For the purposes of the presently claimed invention, the amount of the at least one pH adjusting agent (E) is preferably at least 0.0005 wt. %, more preferably at least 0.005 wt. %, most preferably at least 0.025 wt. %, particularly at least 0.1 wt. %, for example at least 0.4 wt. %, based on the total weight of the composition.

For the purposes of the presently claimed invention, the composition can optionally contain additives. For the purposes of the presently claimed invention, representative examples of additives include, but are not limited to, stabilizers. The additives commonly employed in compositions are for example used to stabilize the dispersion.

For the purposes of the presently claimed invention, the concentration of the additives is not more than 10.0 wt. %, more preferably not more than 1.0 wt. %, most preferably not more than 0.1 wt. %, for example not more than 0.01 wt. %, based on the total weight of the composition. For the purposes of the presently claimed invention, the concentration of the additives is at least 0.0001 wt. %, more preferably at least 0.001 wt. %, most preferably at least 0.01 wt. %, for example at least 0.1 wt. %, based on the total weight of the composition.

A preferred embodiment of the presently claimed invention is directed to a composition comprising the following components:
 (A) at least one inorganic abrasive particle;
 (B) at least one corrosion inhibitor selected from methylbenzethonium, methylbenzethonium salts, benzethonium and benzethonium salts;
 (C) an aqueous medium; and
 (D) at least one corrosion inhibitor selected from polyacrylamides and polyacrylamide copolymers; and
 wherein the pH of the composition is in the range of from ≥5.0 to ≤11.0.

Another preferred embodiment of the presently claimed invention is directed to a composition comprising the following components:
 (A) at least one inorganic abrasive particle;
 (B) at least one corrosion inhibitor selected from methylbenzethonium, methylbenzethonium salts, benzethonium and benzethonium salts;
 (C) an aqueous medium; and
 (D) at least one corrosion inhibitor selected from polyacrylamides and polyacrylamide copolymers; and
 wherein the pH of the composition is in the range of from 6.0 to 10.0.

Another preferred embodiment of the presently claimed invention is directed to a composition comprising the following components:
 (A) at least one inorganic abrasive particle;
 (B) at least one corrosion inhibitor selected from methylbenzethonium, methylbenzethonium salts, benzethonium and benzethonium salts;
 (C) an aqueous medium;
 (D) at least one corrosion inhibitor selected from polyacrylamides and polyacrylamide copolymers; and
 (E) at least one oxidizing agent selected from the group consisting of organic peroxides, inorganic peroxides, persulfates, iodates, potassium hydroxide, ferric nitrate, periodic acids, periodates, permanganates, perchloric acids, perchlorates, phosphoric acids, bromic acids and bromates; and wherein the pH of the composition is in the range of from ≥5.0 to ≤10.0.

Another preferred embodiment of the presently claimed invention is directed to a composition comprising the following components:

(A) at least one inorganic abrasive particle;
(B) at least one corrosion inhibitor selected from methylbenzethonium, methylbenzethonium salts, benzethonium and benzethonium salts;
(C) an aqueous medium;
(D) at least one corrosion inhibitor selected from polyacrylamides and polyacrylamide copolymers;
(E) at least one oxidizing agent selected from the group consisting of organic peroxides, inorganic peroxides, persulfates, iodates, potassium hydroxide, ferric nitrate, periodic acids, periodates, permanganates, perchloric acids, perchlorates, phosphoric acids, bromic acids and bromates; and wherein the pH of the composition is in the range of from ≥5.0 to ≤10.0.

A preferred embodiment of the presently claimed invention is directed to a composition comprising the following components:

(A) ≥0.01 wt. % to ≤10.0 wt. % of at least one inorganic abrasive particle;
(B) ≥0.0001 wt. % to ≤0.009 wt. % of at least one corrosion inhibitor selected from methylbenzethonium, methylbenzethonium salts, benzethonium and benzethonium salts; and
(C) an aqueous medium;

wherein the pH of the composition is in the range of from ≥5.0 to ≤10.0; and wherein weight percentages in each case is based on the total weight of the composition.

A preferred embodiment of the presently claimed invention is directed to a composition comprising the following components:

(A) ≥0.01 wt. % to ≤10.0 wt. % of at least one inorganic abrasive particle;
(B) ≥0.0001 wt. % to ≤0.009 wt. % of at least one corrosion inhibitor selected from methylbenzethonium, methylbenzethonium salts, benzethonium and benzethonium salts; and
(C) an aqueous medium;

wherein the pH of the composition is in the range of from ≥5.5 to ≤9.5; and wherein weight percentages in each case is based on the total weight of the composition.

Another preferred embodiment of the presently claimed invention is directed to a composition comprising the following components:

(A) ≥0.01 wt. % to ≤10.0 wt. % of at least one inorganic abrasive particle;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium; and
(D) ≥0.001 wt. % to ≤0.5 wt % of at least one corrosion inhibitor selected from polyacrylamides and polyacrylamide copolymers;

wherein the pH of the composition is in the range of from ≥6.0 to ≤10.0; and wherein weight percentages in each case is based on the total weight of the composition.

Another preferred embodiment of the presently claimed invention is directed to a composition comprising the following components:

(A) ≥0.01 wt. % to ≤10.0 wt. % of at least one inorganic abrasive particle;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium; and
(D) ≥0.001 wt. % to ≤0.5 wt. % of at least one corrosion inhibitor selected from polyacrylamides and polyacrylamide copolymers;

wherein the pH of the composition is in the range of from ≥6.0 to ≤9.0; and wherein weight percentages in each case is based on the total weight of the composition.

Another preferred embodiment of the presently claimed invention is directed to a composition comprising the following components:

(A) at least one inorganic abrasive particle selected from the group consisting of metal oxides, metal nitrides, metal carbides, silicides, borides, ceramics, diamond, organic hybrid particles, inorganic hybrid particles and silica;
(B) at least corrosion inhibitor selected from methylbenzethonium, methylbenzethonium salts, benzethonium and benzethonium salts; and
(C) an aqueous medium; and wherein the pH of the composition is in the range of from ≥6.0 to ≤10.0.

Another preferred embodiment of the presently claimed invention is directed to a composition comprising the following components:

(A) at least one inorganic abrasive particle selected from the group consisting of metal oxides, metal nitrides, metal carbides, silicides, borides, ceramics, diamond, organic hybrid particles, inorganic hybrid particles and silica;
(B) at least corrosion inhibitor selected from methylbenzethonium, methylbenzethonium salts, benzethonium and benzethonium salts;
(C) an aqueous medium; and
(D) at least one corrosion inhibitor selected from polyacrylamides or a copolymer of acrylamides; and wherein the pH of the composition is in the range of from ≥6.0 to ≤10.0.

Another preferred embodiment of the presently claimed invention is directed to a composition comprising the following components:

(A) colloidal silica;
(B) at least corrosion inhibitor selected from methylbenzethonium, methylbenzethonium salts, benzethonium and benzethonium salts;
(C) an aqueous medium; and
(D) at least one corrosion inhibitor selected from polyacrylamides or a copolymer of acrylamides; and wherein the pH of the composition is in the range of from ≥6.0 to ≤10.0.

Another preferred embodiment of the presently claimed invention is directed to a composition comprising the following components:

(A) colloidal silica;
(B) at least corrosion inhibitor selected from methylbenzethonium, methylbenzethonium salts, benzethonium and benzethonium salts;
(C) an aqueous medium; and
(D) at least one corrosion inhibitor selected from polyacrylamides or a copolymer of acrylamides;
(E) at least one oxidizing agent; and
wherein the pH of the composition is in the range of from ≥6.0 to ≤9.0.

Another preferred embodiment of the presently claimed invention is directed to a composition comprising the following components:
(A) ≥0.01 wt. % to ≤10.0 wt. % of at least one inorganic abrasive particle selected from the group consisting of metal oxides, metal nitrides, metal carbides, silicides, borides, ceramics, diamond, organic hybrid particles, inorganic hybrid particles and silica;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium; and
(D) ≥0.001 wt. % to ≤0.5 wt. % of at least one corrosion inhibitor selected from polyacrylamides or a copolymer of acrylamides;
wherein the pH of the composition is in the range of from ≥5.5 to ≤10.0; and
wherein weight percentages in each case is based on the total weight of the composition.

Another preferred embodiment of the presently claimed invention is directed to a composition comprising the following components:
(A) ≥0.01 wt. % to ≤10.0 wt. % of at least one inorganic abrasive particle selected from the group consisting of metal oxides, metal nitrides, metal carbides, silicides, borides, ceramics, diamond, organic hybrid particles, inorganic hybrid particles and silica;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium; and
(D) ≥0.001 wt. % to ≤0.5 wt. % of at least one corrosion inhibitor selected from polyacrylamides or a copolymer of acrylamides;
wherein the pH of the composition is in the range of from ≥6.0 to ≤10.0; and
wherein weight percentages in each case is based on the total weight of the composition.

Another preferred embodiment of the presently claimed invention is directed to a composition comprising the following components:
(A) ≥0.01 wt. % to ≤10.0 wt. % of at least one inorganic abrasive particle selected from the group consisting of metal oxides, metal nitrides, metal carbides, silicides, borides, ceramics, diamond, organic hybrid particles, inorganic hybrid particles and silica;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium;
(D) ≥0.001 wt. % to ≤0.5 wt. % of at least one corrosion inhibitor selected from polyacrylamides or a copolymer of acrylamides; and
(E) ≥0.01 wt. % to ≤1.0 wt. % of at least one oxidizing agent;
wherein the pH of the composition is in the range of from ≥6.0 to ≤9.0; and
wherein weight percentages in each case is based on the total weight of the composition.

Another preferred embodiment of the presently claimed invention is directed to a composition comprising the following components:
(A) ≥0.01 wt. % to ≤5 wt. % of at least one inorganic abrasive particle selected from the group consisting of metal oxides, metal nitrides, metal carbides, silicides, borides, ceramics, diamond, organic hybrid particles, inorganic hybrid particles and silica;
(B) ≥0.0001 wt. % to ≤0.009 wt. % of at least one corrosion inhibitor selected from methylbenzethonium, methylbenzethonium salts, benzethonium and benzethonium salts;
(C) an aqueous medium;
(D) ≥0.001 wt. % to ≤0.3 wt. % of at least one corrosion inhibitor selected from polyacrylamides or a copolymer of acrylamides; and
(E) ≥0.01 wt. % to ≤1.0 wt. % of at least one oxidizing agent;
wherein the pH of the composition is in the range of from ≥6.0 to ≤9.0; and
wherein weight percentages in each case is based on the total weight of the composition.

The processes for preparation of compositions for inhibition of tungsten etching are generally known. These processes may be applied to the preparation of the composition of the presently claimed invention. This can be carried out by dispersing or dissolving the components described hereinabove (A), (B), (D) and (E) in the aqueous medium (C), preferably water, and optionally by adjusting the pH value through adding an acid, a base, a buffer or a pH adjusting agent (F). For this purpose, the customary and standard mixing processes and mixing apparatuses such as agitated vessels, high shear impellers, ultrasonic mixers, homogenizer nozzles or counter flow mixers, can be used.

An aspect of the presently claimed invention is directed to a process for the manufacture of a semiconductor device comprising the chemical mechanical polishing (CMP) of a substrate (S) used in the semiconductor industry wherein the substrate (S) comprises
(i) tungsten and/or
(ii) tungsten alloys
in the presence of a composition described hereinabove.

The semiconductor device which can be manufactured by the process according to the presently claimed invention is not particularly limited. The semiconductor devices can be electronic components comprising semiconducting materials, as for example silicon, germanium, and III-V materials. Semiconductor devices can be those which are manufactured as single discrete devices or those which are manufactured as integrated circuits (ICs) consisting of several devices manufactured and interconnected on a wafer. Semiconductor devices can be two terminal devices for example a diode, three terminal devices for example a bipolar transistor, four terminal devices for example a Hall effect sensor or multi-terminal devices. Preferably, the semiconductor device is a multi-terminal device. Multi-terminal devices can be logic devices as integrated circuits and microprocessors or memory devices as random-access memory (RAM), read only memory (ROM) and phase change random access memory (PCRAM). Preferably the semiconductor device is a multi-terminal logic device. In particular, the semiconductor device is an integrated circuit or microprocessor.

Generally, in integrated circuits tungsten (W) is used for copper interconnects. The excess tungsten above the dielectrics, can be removed by the chemical mechanical polishing process known.

Generally, this tungsten/tungsten alloy can be produced or obtained in different ways, such as ALD, PVD or CVD processes. Generally, this tungsten and/or tungsten alloy can be of any type, form, or shape. This tungsten and/or tungsten alloy preferably has the shape of a layer and/or overgrowth. If this tungsten and/or tungsten alloy has the shape of a layer and/or overgrowth, the tungsten and/or tungsten alloy content is preferably more than 90%, more preferably more than 95%, most preferably more than 98%, particularly more than 99%, for example more than 99.9% by weight of the corresponding layer and/or overgrowth. This tungsten and/or tungsten alloy has been preferably filled or grown in trenches or plugs between other substrates, more preferably filled or grown in trenches or plugs in dielectric materials like for example SiO2, silicon, low-k (BD1, BD2) or ultra-low-k materials, or other isolating and semiconducting material used in the semiconductor industry. For example, in the Through Silicon Vias (TSV) middle process insolated materials such as polymers, photoresist and/or polyimide can be used as insulating material between the subsequent processing steps of wet etch and CMP for insulating/isolating properties after revealing the TSV from the backside of the wafer.

In an embodiment of the presently claimed invention, the static etching rate or the static etch rate (SER) of tungsten is below 30 Å/min. In a preferred embodiment of the presently claimed invention, the static etch rate (SER) of tungsten is below 28 Å/min. In a more preferred embodiment of the presently claimed invention, the static etch rate (SER) of tungsten is below 25 Å/min.

An aspect of the presently claimed invention is directed to a use of the composition of the presently claimed invention to inhibit etching of tungsten.

The composition according to the presently claimed invention has at least one of the following advantages:
(1) The compositions and the methods of the presently claimed invention show an improved performance in inhibition of etching, especially inhibition of etching of tungsten,
(2) The compositions and the methods of the presently claimed invention prevent erosion of tungsten during chemical mechanical polishing of tungsten-containing substrates,
(3) The composition of the presently claimed invention provides a stable formulation or dispersion, wherein no phase separation occurs,
(4) The process of the presently claimed invention is easy to apply and requires as few steps as possible,
(5) The compositions and the methods of the presently claimed invention do not affect the polishing rates of substrates during chemical mechanical polishing.

EMBODIMENTS

In the following, there is provided a list of embodiments to further illustrate the present disclosure without intending to limit the disclosure to the specific embodiments listed below.

1. A composition for inhibition of tungsten etching comprising
    (A) at least one inorganic abrasive particle;
    (B) at least one corrosion inhibitor selected from methylbenzethonium, methylbenzethonium salts, benzethonium and benzethonium salts; and
    (C) an aqueous medium; and
    wherein the pH of the composition is in the range of from ≥5.0 to ≤11.0.
2. The composition according to embodiment 1, wherein the at least one inorganic abrasive particle (A) is selected from the group consisting of metal oxides, metal nitrides, metal carbides, silicides, borides, ceramics, diamond, organic hybrid particles, inorganic hybrid particles and silica.
3. The composition according to embodiment 1, wherein the at least one inorganic abrasive particle (A) has an average particle diameter in the range of from ≥1 nm to ≤1000 nm, determined according to dynamic light scattering technique.
4. The composition according to embodiment 1, wherein the at least one inorganic abrasive particle (A) is present in a concentration in the range of from ≥0.01 wt. % to ≤10.0 wt. %, based on the total weight of the composition.
5. The composition according to any of embodiments 1 to 4, wherein the at least one corrosion inhibitor (B) is benzethonium.
6. The composition according to any of embodiments 1 to 5, wherein the benzethonium salts are selected from the group consisting of benzethonium fluoride, benzethonium chloride, benzethonium bromide, benzethonium hydroxide and benzethonium citrate.
7. The composition according to any of embodiments 1 to 6, wherein the methylbenzethonium salts are selected from the group consisting of methylbenzethonium fluoride, methylbenzethonium chloride, methylbenzethonium bromide, methylbenzethonium hydroxide and methylbenzethonium citrate.
8. The composition according to any of embodiments 1 to 7, wherein the at least one corrosion inhibitor (B) is present in a concentration in the range of from ≥0.0001 wt. % to ≤0.009 wt. %, based on the total weight of the composition.
9. The composition according to any of embodiments 1 to 8, wherein the aqueous medium (C) is deionized water.
10. The composition according to any of embodiments 1 to 9, wherein the wherein the pH of the composition is in the range of from ≥5.0 to ≤10.0.
11. The composition according to any of embodiments 1 to 10, wherein the wherein the pH of the composition is in the range of from ≥6.0 to ≤9.0.
12. The composition according to any of embodiments 1 to 11, further comprising at least one corrosion inhibitor (D) selected from polyacrylamides and polyacrylamide copolymers.
13. The composition according to embodiment 12, wherein the polyacrylamide copolymers are anionic or non-ionic polyacrylamide copolymers.
14. The composition according to embodiment 12, wherein the polyacrylamides are homopolymers of polyacrylamides.
15. The composition according to embodiment 12, wherein the at least one corrosion inhibitor (D) is present in a concentration in the range of from ≥0.001 wt. % to ≤0.5 wt. %, based on the total weight of the composition.

16. The composition according to embodiment 12, wherein the at least one corrosion inhibitor (D) has a weight average molecular weight in the range of from ≥5000 g/mol to ≤50,000 g/mol, determined according to gel permeation chromatography.
17. The composition according to any of embodiments 1 to 16, further comprising at least one oxidizing agent (E) selected from the group consisting of organic peroxides, inorganic peroxides, persulfates, iodates, potassium hydroxide, ferric nitrate, periodic acids, periodates, permanganates, perchloric acids, perchlorates, phosphoric acids, bromic acids and bromates.
18. The composition according to embodiment 17, wherein the at least one oxidizing agent (E) is present in a concentration in the range of from ≥0.01 wt. % to ≤1.0 wt. %, based on the total weight of the composition.
19. The composition according to any of embodiments 1 to 18 comprising
    (A) ≥0.01 wt. % to ≤10.0 wt. % of at least one inorganic abrasive particle;
    (B) ≥0.0001 wt. % to ≤0.009 wt. % of at least one corrosion inhibitor selected from methylbenzethonium, methylbenzethonium salts, benzethonium and benzethonium salts; and
    (C) an aqueous medium;
    wherein the pH of the composition is in the range of from ≥5.0 to ≤10.0; and
    wherein weight percentages in each case is based on the total weight of the composition.
20. The composition according to any of embodiments 1 to 18 comprising
    (A) ≥0.01 wt. % to ≤10.0 wt. % of at least one inorganic abrasive particle;
    (B) ≥0.0001 wt. % to ≤0.009 wt. % of at least one corrosion inhibitor selected from methylbenzethonium, methylbenzethonium salts, benzethonium and benzethonium salts;
    (C) an aqueous medium; and
    (D) ≥0.001 wt. % to ≤0.5 wt. % of at least one corrosion inhibitor selected from polyacrylamides and polyacrylamide copolymers;
    wherein the pH of the composition is in the range of from ≥5.5 to ≤10.0; and
    wherein weight percentages in each case is based on the total weight of the composition.
21. The composition according to any of embodiments 1 to 18 comprising
    (A) at least one inorganic abrasive particle selected from the group consisting of metal oxides, metal nitrides, metal carbides, silicides, borides, ceramics, diamond, organic hybrid particles, inorganic hybrid particles and silica;
    (B) at least corrosion inhibitor selected from methylbenzethonium, methylbenzethonium salts, benzethonium and benzethonium salts; and
    (C) an aqueous medium; and
    wherein the pH of the composition is in the range of from ≥5.5 to ≤10.0.
22. The composition according to any of embodiments 1 to 18 comprising
    (A) at least one inorganic abrasive particle selected from the group consisting of metal oxides, metal nitrides, metal carbides, silicides, borides, ceramics, diamond, organic hybrid particles, inorganic hybrid particles and silica;
    (B) at least corrosion inhibitor selected from methylbenzethonium, methylbenzethonium salts, benzethonium and benzethonium salts;
    (C) an aqueous medium; and
    (D) at least one corrosion inhibitor (D) selected from polyacrylamides or a copolymer of acrylamides; and
    wherein the pH of the composition is in the range of from ≥5.5 to ≤10.0.
23. The composition according to any of embodiments 1 to 18 comprising
    (A) ≥0.01 wt. % to ≤10.0 wt. % of at least one inorganic abrasive particle selected from the group consisting of metal oxides, metal nitrides, metal carbides, silicides, borides, ceramics, diamond, organic hybrid particles, inorganic hybrid particles and silica;
    (B) ≥0.0001 wt. % to ≤0.009 wt. % of at least corrosion inhibitor selected from methylbenzethonium, methylbenzethonium salts, benzethonium and benzethonium salts;
    (C) an aqueous medium; and
    (D) ≥0.001 wt. % to ≤0.5 wt. % of at least one corrosion inhibitor (D) selected from polyacrylamides or a copolymer of acrylamides;
    wherein the pH of the composition is in the range of from ≥5.5 to ≤10.0; and
    wherein weight percentages in each case is based on the total weight of the composition.
24. A process for the manufacture of a semiconductor device comprising the chemical mechanical polishing of a substrate (S) used in the semiconductor industry wherein the substrate (S) comprises
    (i) tungsten and/or
    (ii) tungsten alloys
    in the presence of a composition as defined in anyone of embodiments 1 to 23.
25. The process according to embodiment 24, wherein the static etch rate (SER) of tungsten is below 30 Å/min.
26. Use of a composition according to any of embodiments 1 to 23 to inhibit etching of tungsten.

While the presently claimed invention has been described in terms of its specific embodiments, certain modifications and equivalents will be apparent to those skilled in the art and are intended to be included within the scope of the presently claimed invention

EXAMPLES

The presently claimed invention is illustrated in detail by the working examples which follow. More particularly, the test methods specified hereinafter are part of the general disclosure of the application and are not restricted to the specific working examples.

The general procedure for the preparation of the slurry and the experiments is described below.

Components:
  silica particles commercially available under the tradename Fuso® PL-3 available from Fuso Chemical Corporation
  benzethonium chloride available from Sigma Aldrich
  deionized water available from BASF SE
  polyacrylamide available from Sigma Aldrich
  hydrogen peroxide available from BASF SE Slurry Composition:
  The slurry composition comprises:
  (A) an inorganic abrasive: silica particles
  (B) a corrosion inhibitor: benzethonium chloride
  (C) deionized water (DIW)

(D) a corrosion inhibitor: polyacrylamide
(E) an oxidizing agent: hydrogen peroxide ($H_2O_2$)

The oxidizing agent (E) (1% $H_2O_2$) was added right before (1 to 15 min) the slurry had been used for Static Etching Rate (SER) determination.

Methods

Procedure for Preparation of the Slurry Composition

The components in the slurry composition were thoroughly mixed and all mixing procedures were carried out under stirring. An aqueous stock solution of each compound (A), (B), (D) and (E) was prepared by dissolving the desired amount of the respective compound in ultra-pure water (UPW). For the stock solutions of the components, potassium hydroxide (KOH) or phosphoric acid ($H_3PO_4$) was preferably used to support dissolution. The pH of the stock solution was adjusted to ~pH 10 by KOH or ~pH 6 by $H_3PO_4$. The stock solutions of (B) had a concentration of the respective additive of 0.001 wt. % of benzethonium chloride solution, that of (D) and (E) of 1.0 wt. %. For (A) a dispersion was used as provided by the supplier, typically about 20%-30% abrasive concentration by weight. The oxidizing agent (E) was used as 30 wt % stock solutions.

To prepare 10000 g of slurry required amount of (B) stock solution was given into a mixing tank or a beaker and then pH was adjusted to 6 or 10 by adding KOH with a stirring speed of 350 rpm. The amounts of stock solutions of (D) were added to reach the desired concentrations. KOH was used to keep the solution at desired pH of 6 or 10. Then (A) was added with the necessary amount. To adjust final concentration, (C) was added as balance water, with respect to the necessary amount of oxidizer stock solution. The pH was adjusted to the desired value by KOH (or $H_3PO_4$). The oxidizer was added with the desired amount (0.1 wt. %) about 60 min before etching.

Inorganic Particles (A) Used in the Examples

Colloidal cocoon-shaped silica particles (A1) having an average primary particle size (d1) of 35 nm and an average secondary particle size (d2) of 70 nm (as determined using dynamic light scattering techniques via a Horiba instrument) (for example Fuso® PL-3) and a specific surface area of around 46 m$^2$/g were used.

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

A2 are agglomerated particles with a specific surface area of around 90 m$^2$/g having an average primary particle size (d1) of 35 nm and an average secondary particle size (d2) of 75 nm (as determined using dynamic light scattering techniques via a Horiba instrument) (for example Fuso® PL-3H) were used.

Measurement of pH

The pH-value was measured with a pH combination electrode (Schott, blue line 22 pH electrode).

Static Etch Rate (SER) Experiment

SER experiments were carried on as the following:
2.5×2.5 cm PVD tungsten (W) were cut and washed with deionized water (DIW).
Each coupon was treated with 0.1% citric acid solution for 4 min and then washed with DIW.
The tungsten (W) film thickness ($d_{before}$) was measured with a 4-point probe.
300 ml of fresh prepared slurry with required hydrogen peroxide concentration was put in a beaker and brought to 60° C.
The tungsten (W) coupon was placed into the slurry and kept in the slurry for 10 min. in the SER apparatus.
The tungsten (W) coupon was removed and rinsed 1 min with DIW and dried with nitrogen.
The tungsten (W) film thickness ($d_{after}$) was measured with the same device again.
The Static Etch Rate (SER) was determined by the following formula:

$$SER(Å/min) = (d_{before} - d_{after})/10$$

TABLE 1

| | Fuso PL3 (wt. %) | Deionised Water (wt. %) | Corrosion inhibitor (B) | Amount of Corrosion inhibitor (B) (wt. %) | Corrosion inhibitor and weight average molecular weight (g/mol) | Amount of Corrosion inhibitor (wt. %) | Hydrogen peroxide (wt. %) | pH | Tungsten-SER (60° C., 10 min) (Å/min) |
|---|---|---|---|---|---|---|---|---|---|
| Example 1* | | 99.9 | | | | | 0.1 | 6.0 | 42.5 |
| Example 2* | | 99.9 | | | | | 0.1 | 10.0 | 46.1 |
| Example 3* | 0.5 | 99.4 | | | | | 0.1 | 6.0 | 31.8 |
| Example 4* | 0.5 | 99.4 | | | | | 0.1 | 10.0 | 53 |
| Example 5* | 0.5 | 99.39 | benzethonium chloride | 0.01 | | | 0.1 | 6.0 | Instable |
| Example 6* | 0.5 | 99.35 | benzethonium chloride | 0.05 | | | 0.1 | 6.0 | Instable |
| Example 7* | 0.5 | 99.39 | benzethonium chloride | 0.01 | | | 0.1 | 10.0 | Instable |
| Example 8* | 0.5 | 99.35 | benzethonium chloride | 0.05 | | | 0.1 | 10.0 | Instable |
| Example 9* | 0.5 | 99.30 | benzethonium chloride | 0.10 | | | 0.1 | 6.0 | Instable |
| Example 10* | 0.5 | 99.20 | benzethonium chloride | 0.20 | | | 0.1 | 6.0 | Instable |

TABLE 1-continued

|  | Fuso PL3 (wt. %) | Deionised Water (wt. %) | Corrosion inhibitor (B) | Amount of Corrosion inhibitor (B) (wt. %) | Corrosion inhibitor and weight average molecular weight (g/mol) | Amount of Corrosion inhibitor (wt. %) | Hydrogen peroxide (wt. %) | pH | Tungsten-SER (60° C., 10 min) (Å/min) |
|---|---|---|---|---|---|---|---|---|---|
| Example 11 | 0.5 | 99.399 | benzethonium chloride | 0.001 |  |  | 0.1 | 6.0 | 2.10 |
| Example 12 | 0.5 | 99.399 | benzethonium chloride | 0.001 |  |  | 0.1 | 7.0 | 3.30 |
| Example 13 | 0.5 | 99.398 | benzethonium chloride | 0.002 |  |  | 0.1 | 8.0 | 5.1 |
| Example 14 | 0.5 | 99.399 | benzethonium chloride | 0.001 |  |  | 0.1 | 9.0 | 24.60 |
| Example 15 | 0.5 | 99.398 | benzethonium chloride | 0.002 |  |  | 0.1 | 6.0 | 1.9 |
| Example 16 | 0.5 | 99.395 | benzethonium chloride | 0.005 |  |  | 0.1 | 6.0 | 0.1 |
| Example 17 | 0.5 | 99.399 | benzethonium chloride | 0.001 | Polyacrylamide 10000 | 0.1 | 0.1 | 6.0 | 0.5 |
| Example 18 | 0.5 | 99.398 | benzethonium chloride | 0.002 | Polyacrylamide 10000 | 0.1 | 0.1 | 6.0 | 0.9 |
| Example 19 | 0.5 | 99.395 | benzethonium chloride | 0.005 | Polyacrylamide 10000 | 0.1 | 0.1 | 6.0 | 0.0 |

*Not within the scope of the presently claimed invention

Discussion of Results

Table 1 shows the Static Etching Rate or Static Etch Rate (SER) of different slurry compositions. The addition of benzethonium chloride as corrosion inhibitor (B) in the slurry provides a SER of tungsten below 30 Amin at the pH ranges provided compared to slurry without any benzethonium chloride as corrosion inhibitor (B) (Examples 1, 2, 3 and 4)

Table 1 shows impact of the concentration of benzethonium chloride in the slurry on the SER. The concentration of benzethonium chloride at and above 0.01 wt. % led to instable formulation. Table 1 also shows the significant impact of pH in the SER of tungsten. The pH range of 5-11 results in lower static etch rates of tungsten (W), specifically as illustrated in Table 1, lower static etch rates of tungsten at pH 6 and above were observed.

The compositions of the examples according to the presently claimed invention show improved performance of low etching behaviour of tungsten and a high dispersion stability.

The invention claimed is:

1. A composition for inhibition of tungsten etching consisting of
    (A) at least one inorganic abrasive particle;
    (B) at least one corrosion inhibitor selected from methylbenzethonium, methylbenzethonium salts, benzethonium and benzethonium salts, wherein the at least one corrosion inhibitor (B) is present in a concentration in the range of from ≥0.0001 wt. % to ≤0.009 wt. %, based on the total weight of the composition; and
    (C) an aqueous medium, wherein the aqueous medium (C) is deionized water; and
    at least one corrosion inhibitor (D) having the weight average molecular weight in the range of from >=5000 g/mol to <=50,000 g/mol, determined according to gel permeation chromatography, and
    at least one oxidizing agent (E) selected from the group consisting of organic peroxides, inorganic peroxides, persulfates, iodates, potassium hydroxide, ferric nitrate, periodic acids, periodates, permanganates, perchloric acids, perchlorates, phosphoric acids, bromic acids and bromates, and
    wherein the pH of the composition is in the range of from ≥6.0 to ≤8.0.

2. The composition according to claim 1, wherein the at least one inorganic abrasive particle (A) is selected from the group consisting of metal oxides, metal nitrides, metal carbides, silicides, borides, ceramics, diamond, organic hybrid particles, inorganic hybrid particles and silica.

3. The composition according to claim 1, wherein the at least one inorganic abrasive particle (A) has an average particle diameter in the range of from ≥1 nm to ≤1000 nm, determined according to dynamic light scattering technique.

4. The composition according to claim 1 wherein the at least one corrosion inhibitor (B) is benzethonium.

5. The composition according to claim 1, wherein the benzethonium salts are selected from the group consisting of benzethonium fluoride, benzethonium chloride, benzethonium bromide, benzethonium hydroxide and benzethonium citrate.

6. The composition according to claim 1, wherein the at least one corrosion inhibitor (D) is selected from polyacrylamides and polyacrylamide copolymers.

7. The composition according to claim 6, wherein the at least one corrosion inhibitor (D) is present in a concentration in the range of from ≥0.001 wt. % to ≤0.5 wt. %, based on the total weight of the composition.

8. The composition according to claim 1, wherein the at least one oxidizing agent (E) is present in a concentration in the range of from 0.01 wt. % to <1.0 wt. %, based on the total weight of the composition.

9. The composition according to claim 1, wherein the at least one oxidizing agent (E) is hydrogen peroxide.

10. A process for the manufacture of a semiconductor device comprising the chemical mechanical polishing of a substrate(S) used in the semiconductor industry wherein the substrate(S) comprises
    (i) tungsten and/or
    (ii) tungsten alloys
    in the presence of a composition as defined in claim 1.

11. The process according to claim 10, wherein the static etch rate (SER) of tungsten is below 30 Å/min.

12. A method for inhibit etching of tungsten comprising providing a composition according to claim 1 and inhibiting etching of tungsten.

* * * * *